(12) United States Patent
Hung et al.

(10) Patent No.: US 6,208,075 B1
(45) Date of Patent: Mar. 27, 2001

(54) CONDUCTIVE FLUOROCARBON POLYMER AND METHOD OF MAKING SAME

(75) Inventors: Liang-Sun Hung; Longru Zheng, both of Webster; Joseph K. Madathil, Rochester, all of NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 09/186,829

(22) Filed: Nov. 5, 1998

(51) Int. Cl.[7] .............................. H01J 1/62; H01J 63/04
(52) U.S. Cl. ........................ 313/504; 313/506; 313/503; 428/690
(58) Field of Search ..................... 313/504, 506, 313/503; 257/40, 99; 428/690, 412

(56) References Cited

U.S. PATENT DOCUMENTS

| | | |
|---|---|---|
| 4,539,507 | 9/1985 | VanSlyke et al. . |
| 4,720,432 | 1/1988 | VanSlyke et al. . |
| 4,769,292 | 9/1988 | Tang et al. . |
| 4,885,211 | 12/1989 | Tang et al. . |
| 5,000,831 | 3/1991 | Osawa et al. . |
| 5,302,420 | * 4/1994 | Nguyen et al. ............. 427/490 |
| 5,663,573 | * 9/1997 | Epstein et al. ............. 313/506 |
| 5,677,572 | 10/1997 | Hung et al. . |

FOREIGN PATENT DOCUMENTS 0 914 025 A1   5/1999   (EP) .

OTHER PUBLICATIONS

*Plasma Polymerization* by H. Yasuda ®1985.
U. Hetzler and E. Kay: "Conduction Mechanism in plasma-polymerized tetrafluorethylene films", J. Appl Physics (1978) 49(11), 5617–23.
Brumlik et al., "Plasma polymerization of sulfonated fluorochlorocarbon lonomer films", Journal of the Electrochemical Society, US, Electrochemistry Society, vol. 141, No. 9, Sep. 1, 1994 (1994–09–01) pp. 2273–2279.
Database WPI, Section Ch, Week 199015, Derwent Publications Ltd., London, CB; Class A85, AN 1990–111190 & JP 02 060939 A (Hitachi Cable Ltd.) Mar. 1, 1990 (1990–03–01).
Database WPI, Section Ch, Week 198932 Derwent Publications Ltd., London, GB; Class A26, AN 1989–230870 & JP 01 165603 A (Canon KK), Jun. 29, 1989.

* cited by examiner

*Primary Examiner*—Ashok Patel
*Assistant Examiner*—Joseph Williams
(74) *Attorney, Agent, or Firm*—Raymond L. Owens

(57) ABSTRACT

A fluorocarbon based conductive polymer and method of making such polymer are disclosed. The conductive polymer is advantageously used in electroluminescent devices.

18 Claims, 10 Drawing Sheets

CONDUCTIVE FLUOROCARBON POLYMER AND METHOD OF MAKING SAME

CROSS REFERENCE TO RELATED APPLICATIONS

Reference is made to commonly assigned U.S. patent application Ser. No. 09/186,538 filed Nov. 5, 1998, entitled "Organic Electroluminescent Device With a Non-Conductive Fluorocarbon Polymer Layer" to Hung; and U.S. patent application Ser. No. 08/961,433 filed Oct. 30, 1997, entitled "A Multistructured Electrode for Use With Electroluminescent Devices" to Hung et al., the disclosures of which are incorporated herein by reference.

FIELD OF THE INVENTION

This invention relates to conductive polymers. More particularly, this invention relates to conductive polymers made by a low-frequency plasma polymerization of fluorocarbon gases.

BACKGROUND OF THE INVENTION

Thin polymerized layers can be generated from organic vapors subjected to glow discharge, and the process is usually called "plasma polymerization". In general, the plasma polymerized layers have some interesting properties, and no catalyst is required in the processing. The emphasis has been on layers produced from hydrocarbon based systems, however, this trend in more recent times has swung towards fluorocarbons.

In most cases electric power generators at radio frequency are utilized to generate plasma. When an organic vapor is introduced into plasma, the monomer gains energy from the plasma through inelastic collision and is fragmented into activated small molecules. These small molecules are recombined to form a large molecule (polymer) and deposited at the surface of a substrate. In this process, the growth of monomers into polymers occurs with the assistance of plasma energy, which involves activated electrons, ions, and radicals.

Plasma polymerization is a thin layer-forming process. The unique feature of plasma polymerization is the formation of a ultra-thin layer with a minimal amount of flaws. The layers usually are cross-linked, insoluble, pinhole-free and heat resistant. With respect to spin coating or vacuum deposition plasma polymerization provides layers with excellent conformality, sufficient durability, and improved adhesion.

Plasma-polymerized thin organic layers are, in general, dielectric materials with insulating properties and extremely low conductivities. For tetrafluoroethylene polymerized by plasma, Vollman and Poll reported dc conductivity values in the range $10^{-17}$–$10^{-18}$ $(ohm\text{-}cm)^{-1}$. Hetzler and Kay (see Plasma Polymerization by H. Yasuda) reported ac conductivities between $10^{-15}$ and $10^{-10}$ $(ohm\text{-}cm)^{-1}$ measured at $10^{-3}$–$10^{5}$ Hz. For very low frequencies, however, the conductivity leveled off to the dc value at $10^{17}$ $(ohm\text{-}cm)^{-1}$, which is in good agreement with Vollman and Poll's data Kay (see Plasma Polymerization by H. Yasuda). Because of the low conductivities, the materials are commonly used as dielectrics or corrosion protective coating.

Doping of acceptor or donor molecules into plasma polymerized layers has been attempted to improve their conductivities, but the results are not successful. Plasma polymerized layers with high electronic conductivities could only be formed from some specific monomers, such as organogermanium or organometallic compounds. Kny et al. Kay (see Plasma Polymerization by H. Yasuda) reported the formation of conductive polymers using the plasma polymerization of tetramethyltin. The magnitude of the conductivity strongly depends on the amount of Tin present in the polymer layers.

The study of conductive polymers started from 1977. It was first reported that polyacetylene, a conjugated organic polymer, could attain high levels of electronic conductivity when oxidized by suitable reagents. The concept of conductivity and electroactivity of conjugated polymers was quickly broadened from polyacetylene to include a number of conjugated hydrocarbon and aromatic heterocyclic polymers, such as poly(p-phenylene), poly(p-phenylene vinylene), poly(p-phenylene sulfide), polypyrrole, and polythiophene, while no success was achieved with fluorocarbon polymers. The principal methods to prepare conducting polymers include electrochemical oxidation of resonance-stabilized aromatic molecules, structure modification along with doping, and synthesis of conducting transition metal-containing polymers. The presence of a large number of conductive polymers has led to a number of potential application. For instance, polymer light-emitting diodes with enhanced performance were fabricated using polyaniline (PANI) network electrodes. The metallic emeraldine salt form of PANI is prepared by protonation with functionalized sulfonic acids, yielding a conducting PANI complex soluble in common organic solvent. However, because of the process complexity and the nature of spinning coating it is not compatible to the fabrication of organic electroluminescence (EL) devices.

SUMMARY OF THE INVENTION

It is an object of this invention to provide a fluorocarbon-based conductive polymer.

This object is achieved by a fluorocarbon based conductive polymer prepared by plasma polymerization of a fluorocarbon gas.

It is another object of the invention to provide an organic light-emitting device which has an organic light-emitting structure formed over an anode. This object is achieved in a device, in which a plasma polymerized polymer layer is used as a hole transporting medium to replace the conventional hole transporting aromatic tertiary amine.

Quite unexpectedly, it has been found in this invention that plasma polymerization of a fluorocarbon gas at low frequencies can provide a conductive polymer layer.

The layers made in accordance with the present invention are highly conductive and have excellent conformality, sufficient durability, and good adhesion to substrates. The process is considerably simpler than the conventional methods to fabricate conductive polymers.

It is more surprising that the application of the polymer layers to electroluminescent devices can substantially enhance hole injection and improve device operational stability.

The drawings are necessarily of a schematic nature, since the thicknesses of the individual layers are too thin, and thickness differences of the various elements too great to permit depiction to scale or to permit convenient proportionate scaling.

DESCRIPTION OF THE PREFERRED EMBODIMENTS

Figure 1:
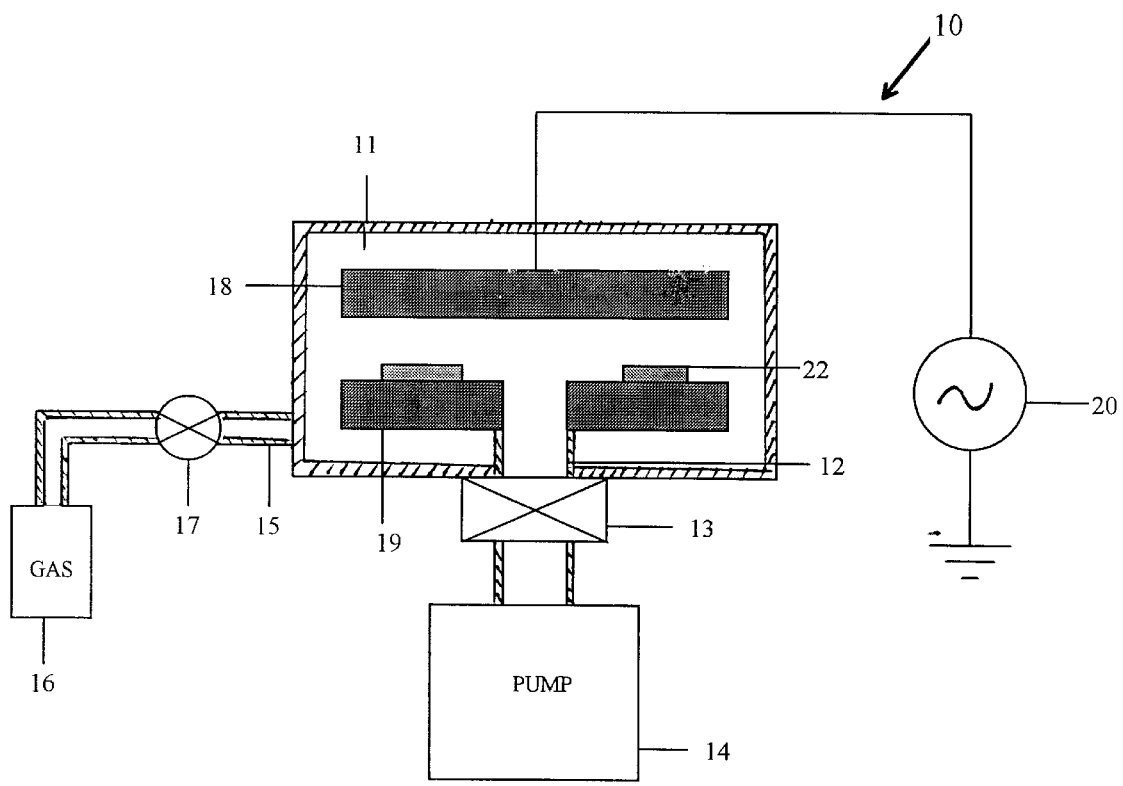
FIG. 1 is a schematic diagram of a plasma polymerization system used in this invention.

Turning now to FIG. 1, there is shown a schematic diagram of a plasma deposition system 10 used in this invention to prepare a conductive polymer layer. The system 10 has a chamber 11. A pump conduit 12 extends through a base plate of the chamber and is connected to a pump 14 via a control valve 13. A gas conduit 15 introduces into the chamber a regulated flow of a fluorocarbon monomer from a gaseous source 16, for example, a $CHF_3$ gas, The flow rate can be adjusted by a controller 17. The pressure of the chamber is determined by several factors, including a gas flow rate entering the chamber and a gas flow rate extracted from the chamber by the pump 14. Two parallel planar electrodes 18 and 19 are used to sustain the glow discharge. A single 45 kHz power generator 20 directs power to the upper electrode 18 through a feedthrough, and a substrate 22 is located on the lower electrode 19.

When a flow of a fluorocarbon gas is introduced into the system, plasma is created due to the ionization of the monomer molecules with accelerated electrons under an electrical field. In this case monomer molecules are activated by plasma to form mono- and di-radicals with fragmentation and rearrangement, and then the radicals recombine with each other to form larger molecules (polymers). Polymers formed by plasma polymerization are highly branched and highly cross-linked. Both the chemical composition and the properties of a plasma polymer are largely dependent on how the monomer molecules are fragmented and on how the fragments are arranged in plasma. Therefore, one can alters operational parameters to achieve a desired plasma polymer.

In this work a rotary pump was used to evacuate the system to a pressure of about 50 mT, and then a flow of a $CHF_3$ gas was introduced into the system. The chamber pressure was determined by the feed-in rate of the gas and the pumping-out rate of the pump, and plasma polymerization was conducted at a pressure of 500 mT. A power of 100 W at a frequency of 45 kHz was used to generate plasma and initiate polymerization. The deposition rate was found to be in the range of 60 nm/min. The term low-frequency as used throughout the specification is a frequency of 500 or less kHz and which can polymerize fluorocarbon gases to form a conductive polymer.

In plasma polymerization, polymer deposition is not affected by the nature of the substrate. A polymer deposits similarly onto the surface of glass, organic polymers, semiconductors, dielectric materials, metals, and metal alloys. Therefor, plasma polymerization as a mean of surface modification is less restricted by the choice of substrate material.

Although using a rotary pump alone can reach low pressuresof $10^{-2}$ mT, the use of a combination of a rotary pump and a high vacuum pump such as a tubromolecular pump is more desirable because of effectively reducing remaining gas in the reaction chamber. The remaining gas includes air and water vapor absorbed at the walls of the reaction chamber.

A design of a reaction chamber can be modified to effectively handle the substrates. A bell jar or tubular chamber made of glass or stainless steel can be used as a reaction chamber. A belljar-type chamber is convenient for massive substrates, and a tubular-type chamber is superior for fibers.

Electric generators are used to create plasma and to ionize atoms and molecules in the polymerization process. The wattage is ranging from 50 to 1,000 W, and the frequency can be selected in the range of 5 to 500 kHz without significantly affecting the conductivity of the plasma fluorocarbon polymer. The preferred range is from 20 to 100 kHz. The electric power is supplied to the reaction chamber through a pair of electrodes either in a capacitive or inductive coupling manner with the electric generators.

The fluorocarbon layers can be prepared by plasma polymerization of fluorocarbon gases, either using a single gaseous source selected from the group of $C_3F_8$, $C_4F_{10}$, $CHF_3$, $C_2F_4$, and $C_4F_8$, or using a dual gaseous source including one fluorocarbon gas having a high F/C ratio (for instance, $C_2F_6$ and $CF_4$) and one hydrogen or hydrocarbon gas to lower the F/C ratio for polymerization. The process can be further modified by the addition of $H_2$, $O_2$ or $N_2$ to a fluorocarbon plasma to achieve desired mechanical and physical properties.

The polymerization is carried at 20–80° C. The actual temperature is largely dependent on operational parameters such as power and deposition time. The resulting polymer layers can be further processed to improve or alter their properties. For instance, the polymer layers can be annealed in various ambient or subjected to another radiation process such as ion implantation or an additional oxygen, nitrogen or hydrogen plasma.

The polymer layers are mainly formed of carbon and fluorine. It may also contain hydrogen and/or a small amount of nitrogen and oxygen. The layers are electrically conductive with a conductivity in the range of $10^{-4}$–$10^{-8}$ (ohm-cm)$^{-1}$. The layers deposited by plasma polymerization of a $CHF_3$ gas in a 45 kHz plasma were investigated by various techniques. X-ray photoelectron spectrometry (XPS) and infrared spectroscopy (IR) showed the presence of cross-linked molecules having $CF_3$, $CF_2$, CF, and C—CF components. Although the composition of the layer quite closed to that reported in the literature with a RF plasma, while the layer exhibited an extremely high conductivity with a value of $10^{-5}$–$10^{-6}$ (ohm-cm)$^{-1}$. Both secondary ion mass spectrometry (SIMS) and Routherford backscattering spectrometry (RBS) revealed a negligible amount of impurities present in the layers, that is insufficient to explain the high electronic conductivity. Electron spin resonance (ESR) measurements indicated a higher spin density of the layer grown in a 45 kHz plasma than that of a layer grown in a RF plasma. The large amount of unpaired electrons is presumably causing electronic conduction of the plasma polymerized layer grown at low frequencies.

Figure 2:
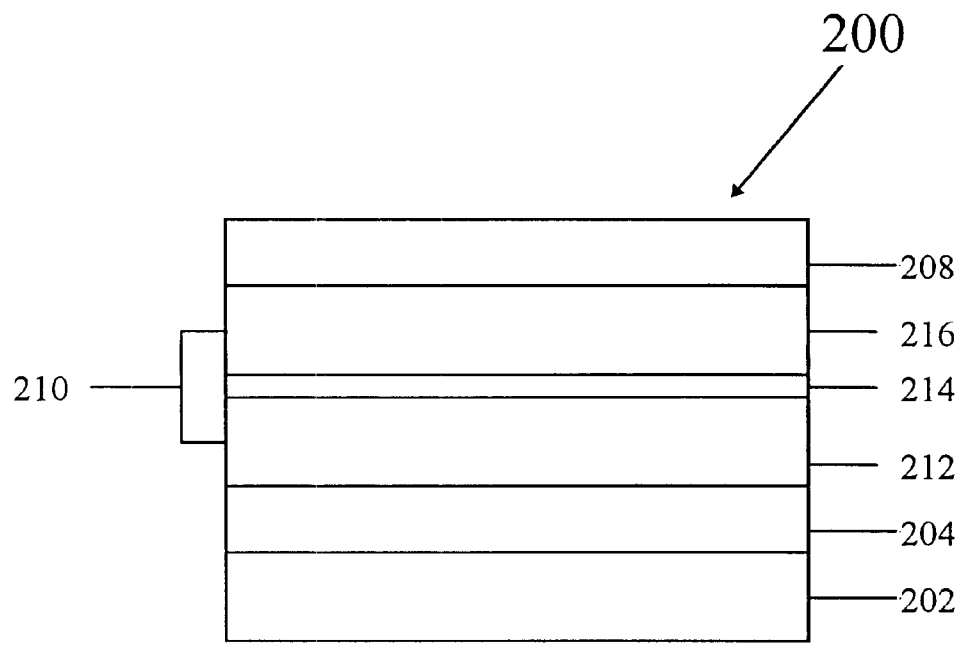
FIG. 2 is a schematic diagram of an organic light-emitting device (prior art) in which a light-emitting structure is deposited on an ITO anode.

Turning to FIG. 2, an organic light-emitting device 200 (prior art) has a light-transmissive substrate 202 on which is disposed a light-transmissive anode 204. An organic light-emitting structure 210 is formed between the anode 204 and a cathode 208. The organic light-emitting structure 210 is comprised of, in sequence, an organic hole-transporting layer 212, an organic light-emitting layer 214, and an organic electron-transporting layer 216. When an electrical potential difference (not shown) is applied between the anode 204 and the cathode 208, the cathode will inject electrons into the electron-transporting layer 216, and the electrons will traverse the electron-transporting layer 216 and the light-emitting layer 214. At the same time, holes will be injected from the anode 204 into the hole-transporting layer 212. The holes will migrate across layer 212 and recombine with electrons at or near a junction formed between the hole-transporting layer 212 and the light-emitting layer 214. When a migrating electron drops from its conduction band to a valance band in filling a hole, energy is released as light which, and is emitted through the light-transmissive anode 204 and substrate 202.

The light-transmissive substrate 202 may be constructed of glass, quartz, or a plastic material. The anode 204 is preferably constructed of a combination of light-transmissive and electrically conductive metal oxides such as indium oxide, tin oxide, or optimally, indium tin oxide (ITO). In order to function as an effective hole-injecting electrode, the anode 204 must have a work function in excess of 4.0 eV ITO has a work function of about 4.7 eV.

The organic light-emitting structure 210 is preferably constructed by sequential vapor deposition of the hole-transporting layer 212, the light-emitting layer 214, and the electron-transporting layer 216.

Following the teachings of VanSlyke et al. U.S. Pat. No. 4,539,507, hereby incorporated by reference, the hole-transporting layer 212 preferably contains at least one aromatic tertiary amine.

A preferred class of selected aromatic tertiary amines are those which include at least two aromatic tertiary amine moieties. Such compounds include those represented by structural formula (I):

(I)

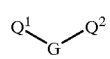

wherein $Q^1$ and $Q^2$ are independently aromatic tertiary amine moieties, and

G is a linking group such as arylene, cyclo-alkylene, or alkylene group or a carbon to carbon bond, at least one of $Q^1$ and $Q^2$ and G including a fused aromatic ring moiety as described above. In a specifically preferred form each of $Q^1$ and $Q^2$ includes a fused aromatic ring moiety, optimally a fused naphthyl moiety, bonded to an amine nitrogen atom. When G is an arylene moiety, it is preferably a phenylene, biphenylene or naphthylene moiety.

A particularly preferred class of triaryl-amines satisfying structural formula (I) and containing two triarylamine moieties are those satisfying structural formula (II):

(II)

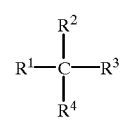

where $R^1$ and $R^2$ each independently represents a hydrogen atom, an aryl group, or an alkyl group or $R^1$ and $R^2$ together represent the atoms completing a cycloalkyl group, and $R^3$ and $R^4$ each independently represents an aryl group which is in turn substituted with a diaryl substituted amino group, as indicated by structural formula (III):

(III)

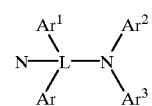

wherein $R^5$ and $R^6$ are independently selected aryl groups. At least one of the aryl groups attached to the amine nitrogen atom of formula (III) is a fused aromatic ring moiety as described above. In a specifically preferred form at least one $R^5$ and $R^6$ is a fused aromatic ring moiety, optimally a naphthyl moiety.

Another preferred class of selected aromatic tertiary amines are tetraaryldiamines. Preferred tetraarylclamines include two diarylamino groups, such as indicated by formula (III), linked through an arylene group. Preferred tetraaryldiamines include those represented by formula (IV).

(IV)

wherein

Ar, $Ar^1$, $Ar^2$ and $Ar^3$ are independently selected from among phenyl, biphenyl and naphthyl moieties, L is a divalent naphthylene moiety or $d_n$, d is a phenylene moiety, n is an integer of from 1 to 4, and at least one of Ar, $Ar^1$, $Ar^2$ and $Ar^3$ is a naphthyl moiety when L is $d_n$.

The various alkyl, alkylene, aryl, and arylene moieties of the foregoing structural formulae (I), (II), (III), and (IV) can each in turn be substituted. Typical substituents including alkyl groups, alkoxy groups, aryl groups, aryloxy groups, and halogen such as fluoride, chloride, and bromide. The various alkyl and alkylene moieties typically contain from about 1 to 6 carbon atoms. The cycloalkyl moieties can contain from 3 to about 10 carbon atoms, but typically contain five, six, or seven ring carbon atoms, e.g. cyclopentyl, cyclohexyl, and cycloheptyl ring structures. When the aryl and arylene moieties are not fused aromatic ring moieties, they are preferably phenyl and phenylene moieties.

While the entire hole transporting layer of the organic light-emitting structure 210 can be formed of a single selected aromatic tertiary amine of the type described above, it is recognized that combinations of selected aromatic tertiary amines can be employed to advantage and that combinations of selected aromatic tertiary amines (ATA) of the type described above with aromatic tertiary amines of the type disclosed by VanSlyke et al. U.S. Pat. No. 4,720, 432, i.e., aromatic tertiary amines lacking a fused aromatic ring moiety, can be employed. Apait from the differences specifically noted, the teachings of VanSlyke et al. U.S. Pat. No. 4,720,432, hereby incorporated by reference, are generally applicable to the EL devices of this invention.

Illustrative of useful selected (fused aromatic ring containing) aromatic tertiary amines are the following:
ATA-1  4,4'-Bis[N-(1-naphthyl)-N-phenylamino]biphenyl
ATA-2  4,4"-Bis[N-(1-naphthyl)-N-phenylamino]-p-terphenyl
ATA-3  4,4'-Bis[N-(2-naphth yl)-N-phenylamino]biphenyl
ATA-4  4,4'-Bis[N-(3-acenaphthenyl)-N-phenyl-amino]biphenyl
ATA-5  1,5-Bis[N-(1-naphthyl)-N-phenylamino]naphthalene
ATA-6  4,4'-Bis[N-(9-anthryl)-N-phenylamino]-iphenyl
ATA-7  4,4"-Bis[N-(1-anthryl)-N-phenylamino]-p-terphenyl
ATA-8  4,4'-Bis[N-(2-phenanthryl)-N-phenyl-amino]biphenyl
ATA-9  4,4'-Bis[N-(8-fluoranthenyl)-N-phenyl-amino]biphenyl
ATA-10  4,4'-Bis[N-(2-pyrenyl)-N-phenylamino]bi-phenyl
ATA-11  4,4'-Bis[N-(2-naphthacenyl)-N-phenyl-amino]biphenyl
ATA-12  4,4'-Bis [N-(2-perylenyl)-N-phenylamino]biphenyl
ATA-13  4,4'-Bis[N-(1-coronenyl)-N-phenylamino]biphenyl
ATA-14  2,6-Bis(di-p-tolylamino)naphthalene
ATA-15  2,6-Bis[di-(1 -naphtyl)amino]naphthalene
ATA-16  2,6-Bis[N-(1-naphthyl)-N-(2-naphthyl)-amino]naphthalene
ATA-17  N,N,N',N'-Tetra(2-naphthyl)-4,4"-di-amino-p-terphenyl
ATA-18  4,4'-Bis{N-phenyl-N-[4-(1-naphthyl)-phenyl]amino}biphenyl
ATA-19  4,4'-Bis[N-phenyl-N-(2-pyrenyl)amino]biphenyl
ATA-20  2,6-Bis [N,N-di(2-naphthyl)amine]fluorene
ATA-21  1,5-Bis[N-(1-naphthyl)-N-phenylamino]naphthalene The light-emitting layer of the organic EL device comprises of a luminescent or fluorescent material where electroluminescence is produced as a result of electron-hole pair recombination in this region. In the simplest construction, the light-emitting layer comprises of a single component, that is a pure material with a high fluorescent efficiency. A well known material is tris (8-quinolinato) aluminum, (Alq), which produces excellent green electroluminescence. A preferred embodiment of the luminescent layer comprises a multi-component material consisting of a host material doped with one or more components of fluorescent dyes. Using this method, highly efficient EL devices can be constructed. Simultaneously, the color of the EL devices can be tuned by using fluorescent dyes of different emission wavelengths in a common host material. This dopant scheme has been described in considerable details for EL devices using Alq as the host material by Tang et al. in U.S. Pat. No. 4,769,292.

Preferred materials for use in forming the electron transporting layer of the organic EL devices of this invention are metal chelated oxinoid compounds, including chelates of oxine itself (also commonly referred to as 8-quinolinol or 8-hydroxyquinoline). Such compounds exhibit both high levels of performance and are readily fabricated in the form of thin layers.

The organic EL devices can employ a cathode constructed of any metal having a work function lower than 4.0 eV, such as calcium and lithium. Unexpected fabrication, performance, and stability advantages have been realized by forming the cathode of a combination of a low work function metal and at least one other metal. For further disclosure, see U.S. Pat. No. 4,885,211 by Tang and Van Slyke, the disclosure of which is incorporated by reference herein. A bilayer structure of LiF/Al has been used to enhance electron injection, as disclosed in U.S. Pat. No. 5,677,572 by Hung et al.

Figure 3:
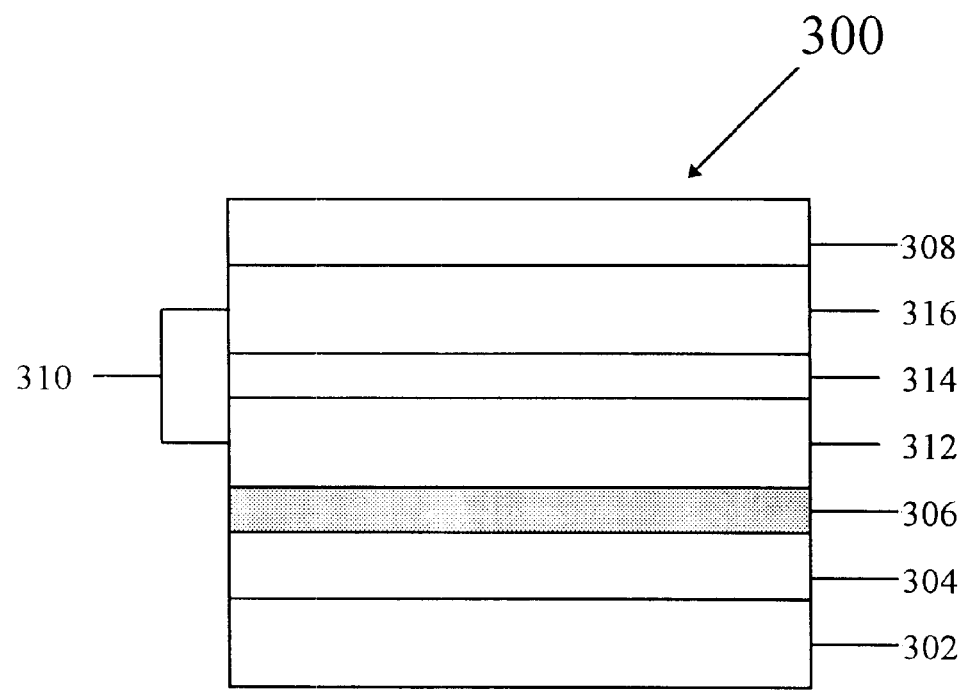
FIG. 3 is a schematic diagram of an organic light-emitting device in which a light-emitting structure is deposited over an ITO anode with a fluorocarbon polymer layer interposed between the light-emitting structure and the ITO anode.

Turning now to FIG. 3, an organic light-emitting device 300 is constructed to test the electronic conductivity of the polymer layers generated at different conditions. A light-transmissive substrate 302, a light-transmissive anode 304, and an organic light-emitting structure 310, comprised of, in sequence, an organic hole-transporting layer 3:12, an organic light-emitting layer 314, an organic electron-transporting layer 316, and a cathode 308 corresponding to the elements 202, 204, 210, 212, 214, 216, and 208, respectively, of the prior art device 200 of FIG. 2. Accordingly, the aforementioned corresponding elements of the organic light-emitting device 200 and their construction and function require no further description. However, the difference between FIG. 2 and FIG. 3 is a plasma polymer layer 306 interposed between the light-emitting structure and the ITO anode in the devices of FIG. 3.

Figure 4:
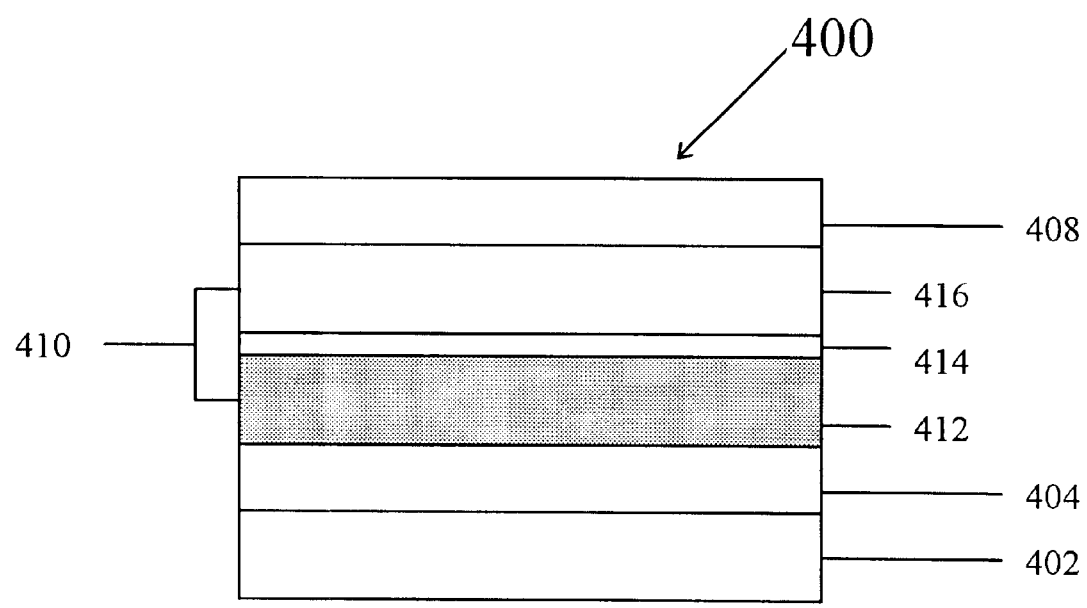
FIG. 4 is a schematic diagram of an organic light-emitting device in which a light-emitting structure is deposited over an ITO anode with a fluorocarbon polymer layer as a hole-transporting layer.

Turning now to FIG. 4, an organic light-emitting device 400 is constructed in accordance with the present invention. A light-transmissive substrate 402, a light-transmissive anode 404, and an organic light-emitting structure 410, comprised of, in sequence, a conductive polymer layer 412, an organic light-emitting layer 414, and an organic electron-transporting layer 416. The elements 402, 404, 408, 410, 414, and 416 correspond to the elements 202, 204, 208, 210, 214, and 216, respectively, of the prior art device 200 of FIG. 2. Accordingly, the aforementioned corresponding elements of the organic light-emitting device 200 and their construction and function require no further description.

However, in this structure the conductive polymer layer is replaced for the conventional hole-transporting layer having a small molecule structure. Surprisingly, the plasma polymer layer 412, which has a preferred thickness in a range of 30–150 nm, shows sufficiently high hole mobility.

Figure 5:
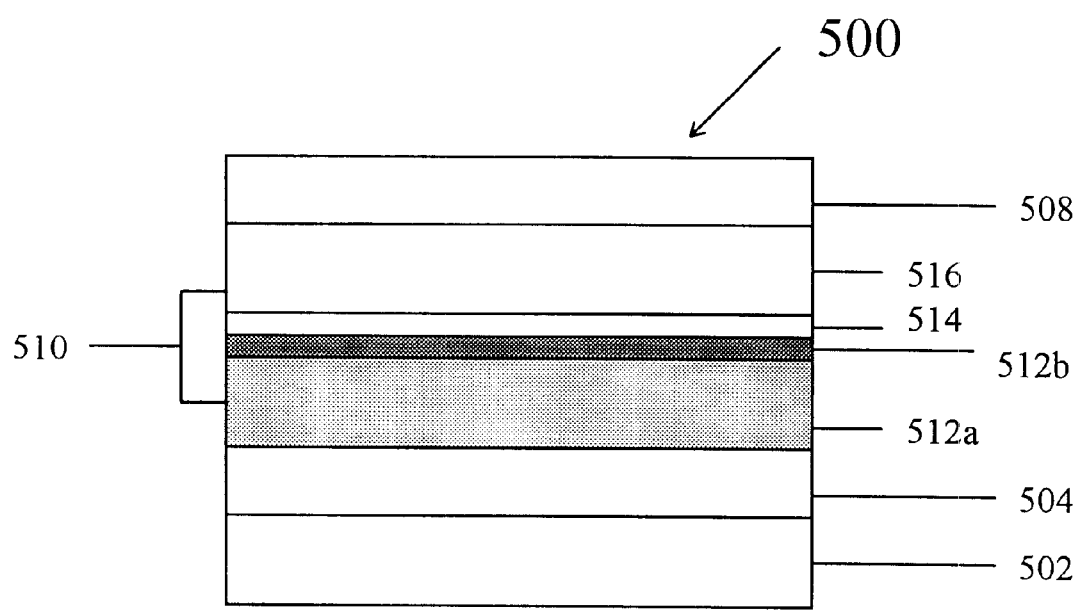
FIG. 5 is a schematic diagram of an organic light-emitting device in which a light-emitting structure is deposited over an ITO anode with a hole. transporting layer formed of a fluorocarbon polymer and a thin buffer layer overlying the polymer layer.

Turning now to FIG. 5, an organic light-emitting device 500 is constructed in accordance with the present invention. A light-transmissive substrate 502, a light-transmissive anode 504, and an organic light-emitting structure 510, comprised of, in sequence, a conductive polymer layer 512*a*, an thin buffer layer 512*b*, an organic light-emitting layer 514, and an organic electron- transporting layer 516. The elements 502, 504, 508, 510, 514, and 516 correspond to the elements 202, 204, 208, 210, 214, and 216, respectively, of the prior art device 200 of FIG. 2. Accordingly, the aforementioned corresponding elements of the organic light-emitting device 200 and their construction and function require no further description.

However, in this structure the conductive polymer layer 512*a* is replaced for the conventional hole-transporting layer consisting having a small molecule structure, and a thin buffer layer 512*b* is overlying the polymer layer. Surprisingly, the polymer buffer layer, which has a preferred thickness in a range of 30–1500 nm, shows sufficiently high hole mobility; and the buffer layer, which has a preferred thickness in a range of 1–10 nm, can considerably improve operational stability of the devices.

The buffer layer can contain aromatic tertiary amine. It is a compound containing at least one trivalent nitrogen atom that is bonded only to carbon atoms, at least one of which is a member of an aromatic ring. In one form the aromatic tertiary amine can be an arylamine, such as a monarylamine, diarylamine, triarylamine, or a polymeric arylamine.

As is shown in the preceding parts, the polymer has good electroconductive properties and can be used in organic electroluminescence devices to reduce derive voltage and improve operational stabilities. The material and its preparation are unique and may have potential applications in other injecting devices or in the field other than electroluminescence devices, including electrodes for batteries, fuel cells, electrochromics, chemical and biochemical sensors, ion exchange and release devices, and neutron detection.

EXAMPLES

The following examples are presented for a further understanding of the invention. For purposes of brevity, the materials and the layers formed therefrom will be abbreviated as given below:

ITO: indium tin oxide (anode)
NPB: 4,4'-bis-[N-(1-naphthyl)-N-phenylamino]-bi-phenyl (hole-transporting layer)
Alq: tris (8-quinolinolato-N41, 08)-aluminum (electron-transporting layer; functioning here as a combined light-emitting layer and electron-transporting layer)
MgAg: magnesium:silver at a ratio of 10:1 by volume (cathode)

Example 1 a) an ITO-coated glass was ultrasonicated in a commercial detergent, rinsed in deionized water, degreased in toluene vapor, and subjected to an oxygen plasma for 3 min.
b) a 50 nm thick Au layer was deposited on the ITO layer by thermal evaporation.

Example 2 a) an ITO-coated glass was ultrasonicated in a commercial detergent, rinsed in deionized water, degreased in toluene vapor, and subjected to an oxygen plasma for 3 min.
b) a 50 nm thick NPB hole-transporting layer was deposited on the ITO layer by conventional thermal vapor deposition;
c) a 50 nm thick Au layer was deposited on the NPB layer by thermal evaporation.

Example 3 a) an ITO-coated glass was ultrasonicated in a commercial detergent, rinsed in deionized water, degreased in toluene vapor, and subjected to an oxygen plasma for 3 min.
b) a 50 nm thick plasma polymer was deposited on the ITO layer by polymerization of a $CHF_3$ gas in a 45 kHz plasma;
c) a 50 nm thick Au layer was deposited on the polymer layer by thermal evaporation.

Example 4

An organic light-emitting structure as a prior art was constructed in the following manner:
a) a light-transmissive anode of ITO-coated glass was ultrasonicated in a commercial detergent, rinsed in deionized water, degreased in toluene vapor, and subjected to an oxygen plasma for 3 min;
b) a 60 nm thick NPB hole-transporting layer was deposited on the ITO layer by conventional thermal vapor deposition;
c) a 75 nm thick Alq electron-transporting and light-emitting layer was deposited on the NPB layer by conventional thermal vapor deposition;
d) a 200 nm thick MgAg layer was deposited on the Alq layer by co-evaporation from two sources (Mg and Ag).

Example 5

An organic light-emitting structure was constructed in the following manner:
a) a light-transmissive anode of ITO-coated glass was ultrasonicated in a commercial detergent, rinsed in deionized water, degreased in toluene vapor, and subjected to an oxygen plasma for 3 min;
b) a plasma polymer layer with a thickness in the range of 10–40 nm was deposited on the ITO layer by polymerization of a $CHF_3$ gas in a 45 kHz plasma;
c) a 60 nm thick NPB hole-transporting layer was deposited on the plasma polymer layer by conventional thermal vapor deposition;
d) a 75 nm thick Alq electron-transporting and light-emitting layer was deposited on the NPB layer by conventional thermal vapor deposition. a 200 nm thick MgAg layer was deposited on the Alq layer by co-evaporation from two sources (Mg and Ag).

Example 6

An organic light-emitting structure according to this invention was constructed in the following manner:
a) a light-transmissive anode of ITO-coated glass was ultrasonicated in a commercial detergent, rinsed in deionized water, degreased in toluene vapor, and subjected to an oxygen plasma for 3 min;
b) a 30 nm polymer layer was deposited on the ITO layer by polymerization of a $CHF_3$ gas in a RF plasma;
c) a 60 nm thick NPB hole-transporting layer was deposited on the plasma polymer layer by conventional thermal vapor deposition;
d) a 75 nm thick Alq electron-transporting and light-emitting layer was deposited on the NPB layer by conventional thermal vapor deposition.
e) a 200 nm thick MgAg layer was deposited on the Alq layer by co-evaporation from two sources (Mg and Ag).

Example 7

An organic light-emitting structure according to this invention was constructed in the following manner:
a) a light-transmissive anode of ITO-coated glass was ultrasonicated in a commercial detergent, rinsed in deionized water, degreased in toluene vapor, and subjected to an oxygen plasma for 3 min;

b) a 50 nm plasma polymer layer was deposited on the ITO layer by polymerization of a $CHF_3$ gas in a 45 kHz plasma;

c) a 75 nm thick Alq electron-transporting and light-emitting layer was deposited on the polymer layer by conventional thermal vapor deposition.

d) a 200 nm thick MgAg layer was deposited on the Alq layer by co-evaporation from two sources (Mg and Ag).

Example 8

An organic light-emitting structure according to this invention was constructed in the following manner:

a) a light-transrnissive anode of ITO-coated glass was ultrasonicated in a commercial detergent, rinsed in deionized water, degreased in toluene vapor, and subjected to an oxygen plasma for 3 min;

b) a 50 nm plasma polymer layer was deposited on the ITO layer by polymerization of a $CHF_3$ gas in a 45 kHz plasma;

c) a 1–5 nm NPB buffer layer was deposited on the plasma layer by conventional thermal evaporation;

d) a 75 nm thick Alq electron-transporting and light-emitting layer was deposited on the buffer layer by conventional thermal vapor deposition.

d) a 200 nm thick MgAg layer was deposited on the Alq layer by co-evaporation from two sources (Mg and Ag).

Each of the devices was tested by applying a drive voltage between the anode and the cathode. A current-drive voltage relationship was determined, as shown in FIGS. 6, 7, 8, and 9, a relationship between EL output and drive current was determined, as shown in FIG. 10, and operational stability of devices was determined, as shown in FIG. 11.

Figure 6:
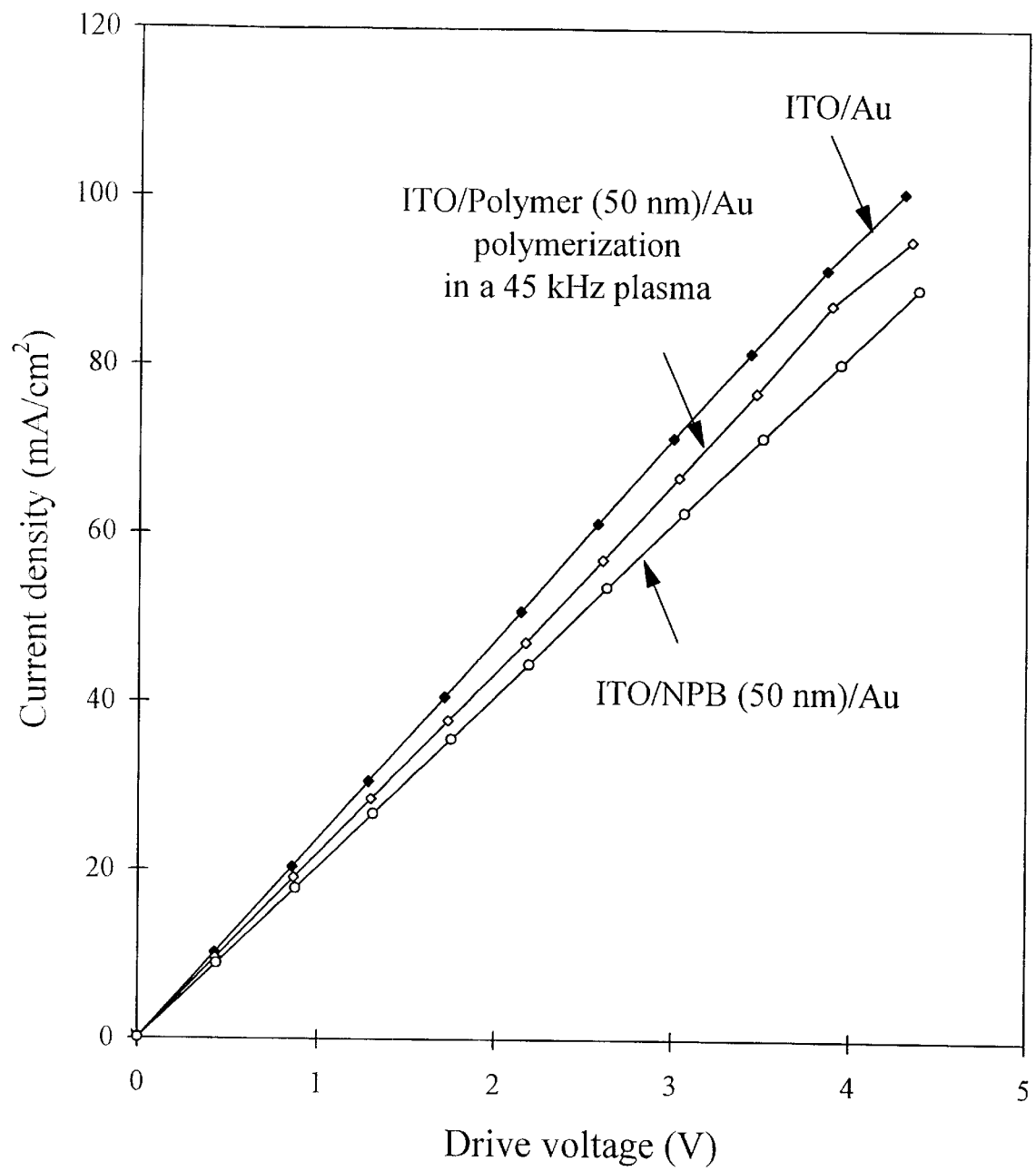
FIG. 6 shows in graphic form the current-voltage relationships when a voltage is applied to a layered structure of Au/ITO, Au/Fluorocarbon Polymer/ITO and Au/NPB/ITO.

In FIG. 6 the current-voltage characteristics were plotted for devices of Examples 1, 2, and 3. Since ITO was used to form a contact and act as a connector to an electric power generator, the 400 ohm resistance derived from the I-V curve of Example 1 represents the ITO series resistance. By a comparison of the I-V curves measured on the devices of Examples 2 and 3, it could be readily concluded that the plasma polymer is more conducting than the NPB, and the resistivity of the polymer layer was determined to be in the range of $10^5$ ohm-cm.

Figure 7:
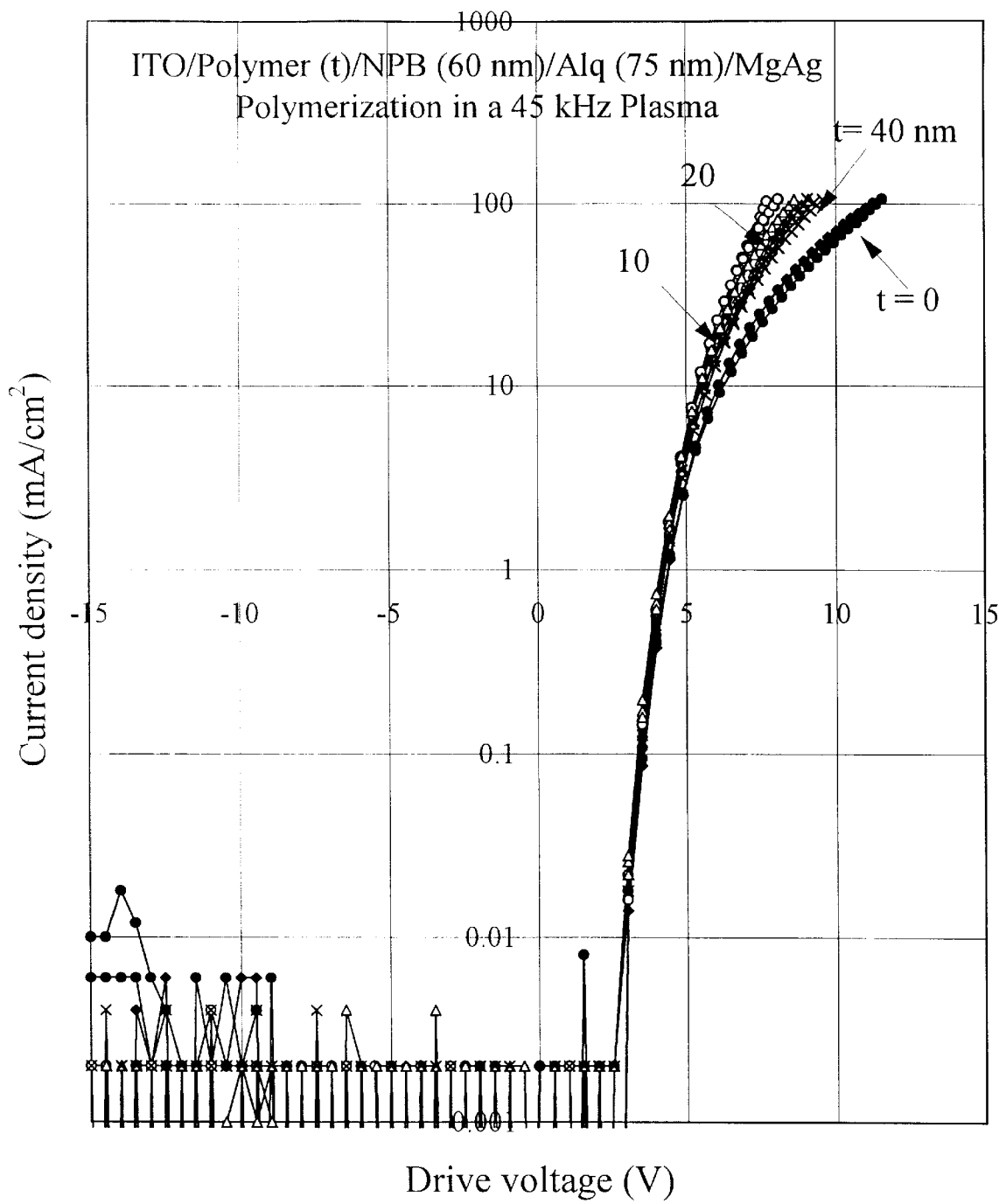
FIG. 7 shows in graphic form the current-voltage relationships of organic light-emitting devices of FIGS. 2 and 3 with the polymer layer prepared in a 45 kHz plasma.

In FIG. 7 the current density of the devices described in Examples 4 and 5 is plotted as a function of drive voltage. It is seen from the figure that when a 10–40 nm thick plasma polymer layer was interposed between the ITO anode and the hole-transporting layer NPB, the devices show a faster rising I-V curve than that obtained from a prior art device. The results unambiguously indicate that the polymer layer fabricated by plasma polymerization of fluorocarbon gases in a 45 kHz plasma is quite conductive.

Figure 8:
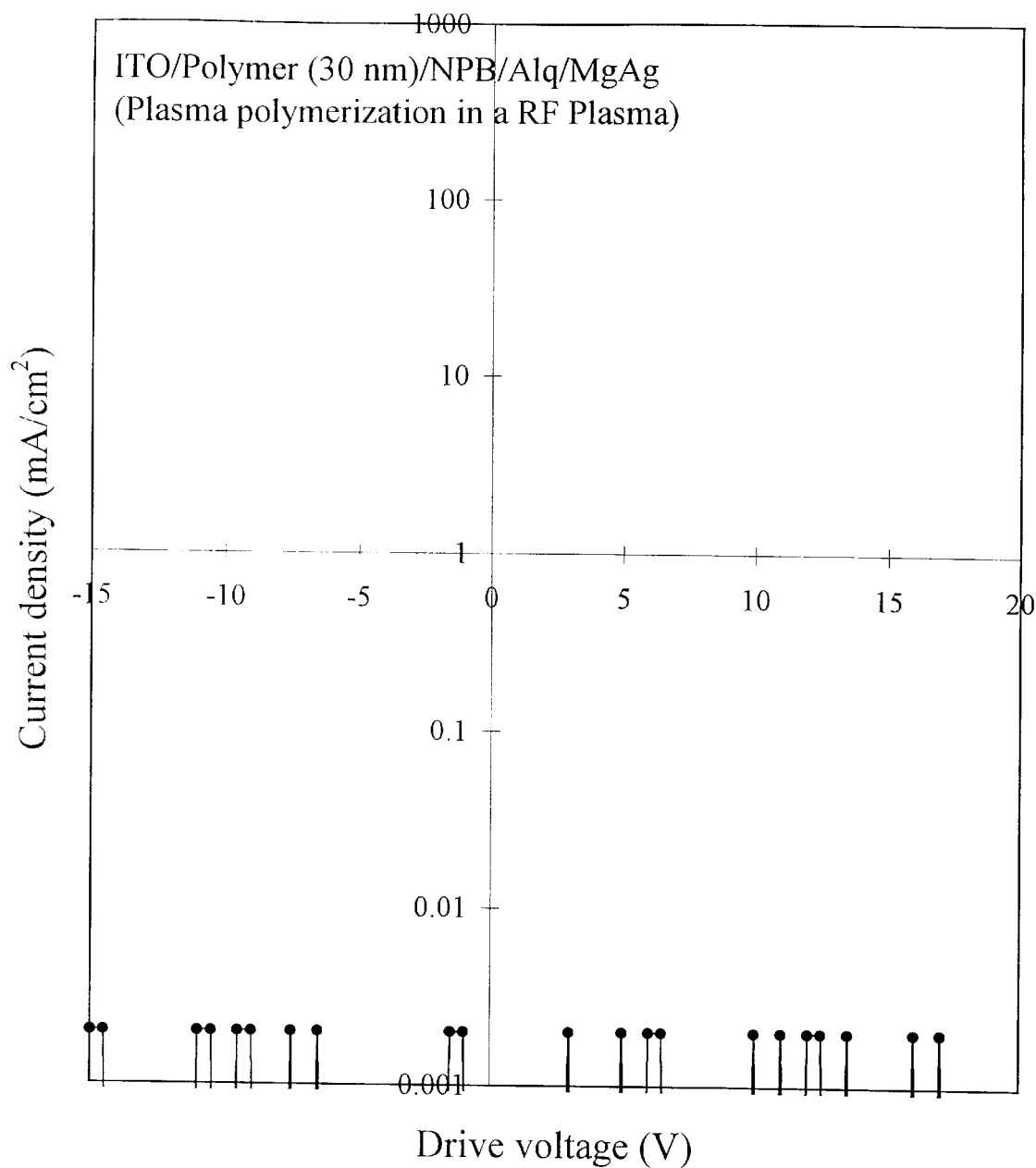
FIG. 8 shows in graphic form the current-voltage relationships of organic light-emitting devices of FIGS. 2 and 3 with the polymer layer prepared in a 13.6 MHz plasma.

In FIG. 8 the current density of the devices described in Example 6 is plotted as a function of drive voltage. No current is seen in the plot even at a voltage up to 20 V, thus indicating an extremely low conductivity of the polymer layer. It is, therefore, obvious from the figure that the polymer layers generated by plasma polymerization of fluorocarbon gases in a RF plasma is non-conducting, in consistent with the report in the literature that plasma-polymerized thin organic layers are dielectric materials with insulating properties.

Figure 9:
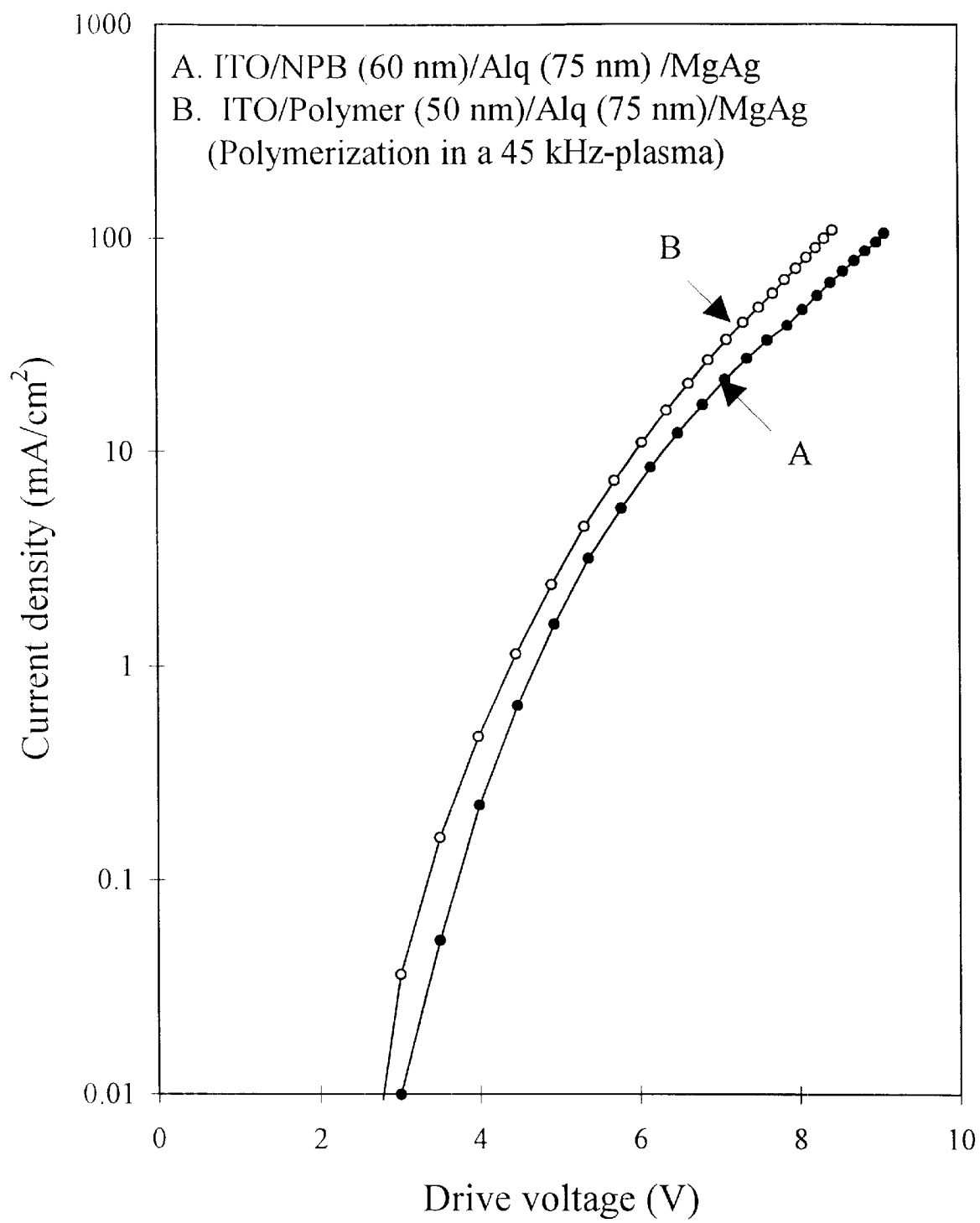
FIG. 9 shows in graphic form the current-voltage relationships of organic light-emitting devices of FIGS. 2 and 4 with the polymer layer prepared in a 45 kHz plasma.
Figure 10:
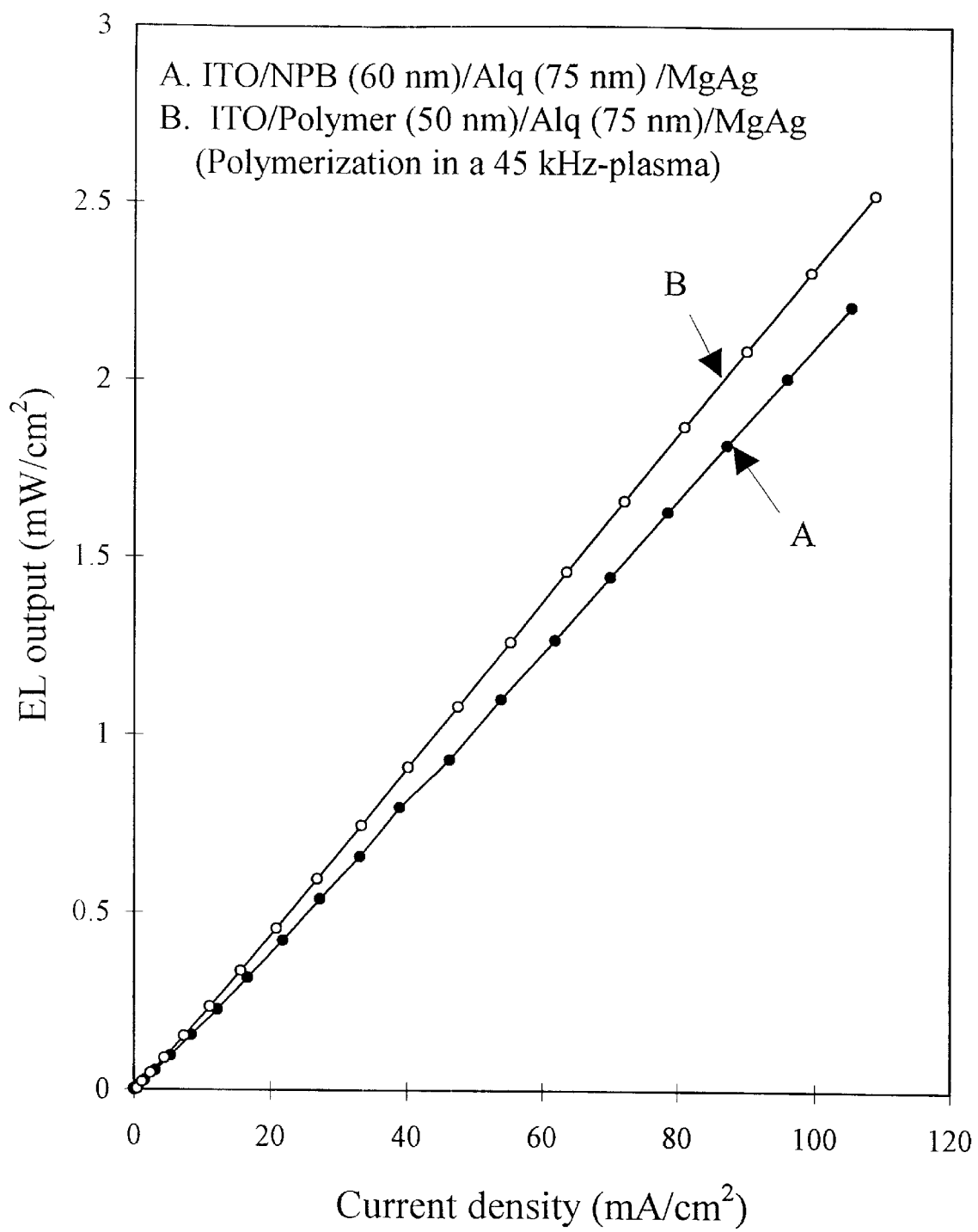
FIG. 10 shows in graphic form the EL output-current relationships of organic light-emitting devices of FIGS. 2 and 4 with the polymer layer prepared in a 45 kHz plasma.
Figure 11:
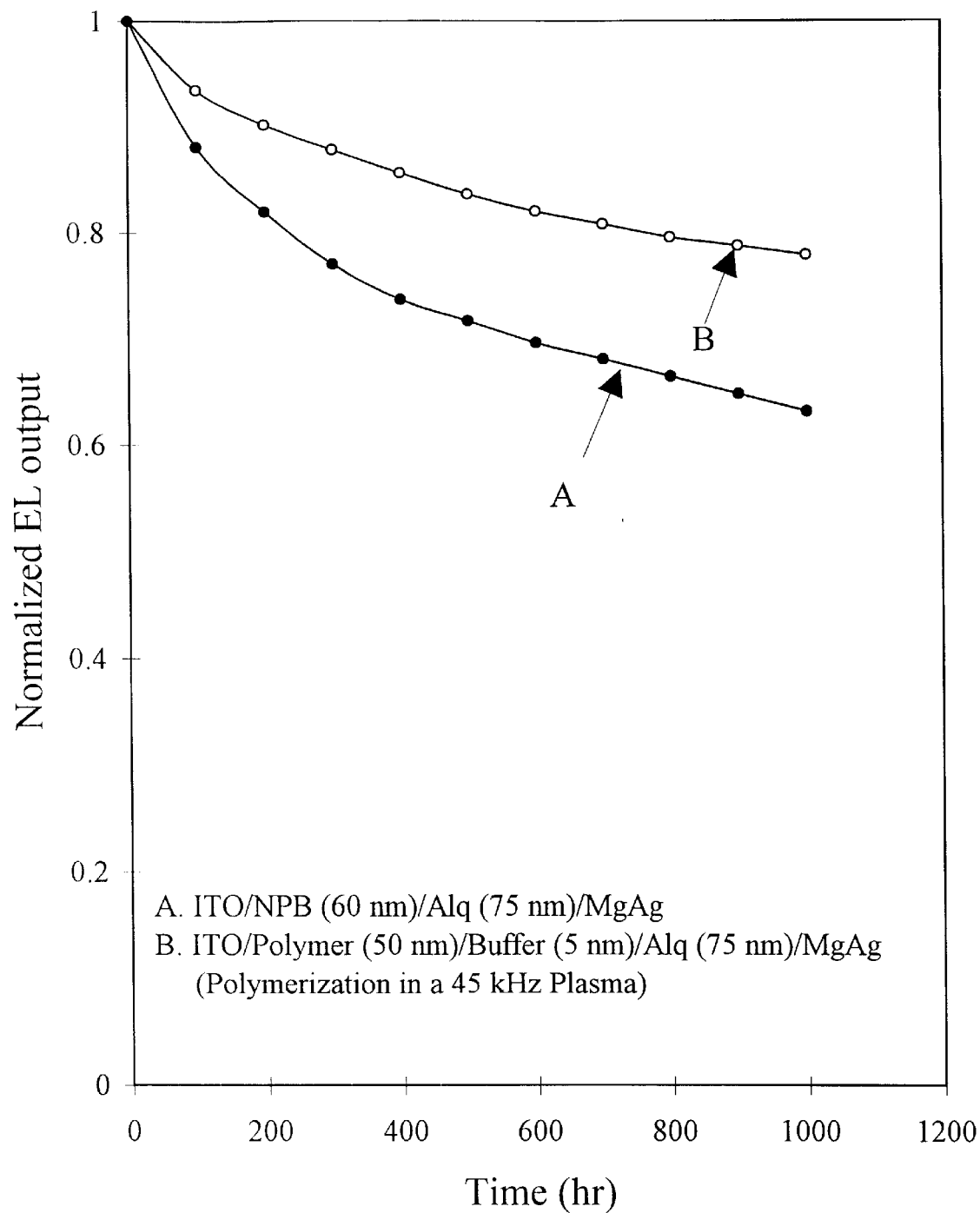
FIG. 11 shows in graphic form EL output as a function of operation time for the organic electroluminescent devices of FIGS. 2 and 5.

FIGS. 9 and 10 show that one can replace the conductive polymer for the conventionally used hole-transporting material. FIG. 9 shows the current density-voltage characteristics measured on the devices of Examples 4 and 7. It is apparent from the figure that the device with a polymer hole-transporting layer has a higher current density than the device with a NPB hole-transporting layer at the same voltage. Moreover, the one with a polymer layer has a higher quantum efficiency than the other one, as shown in FIG. 10.

FIG. 11. shows plots of operational stability for the devices of Examples 4 and 8. The devices were operated at a constant current of 20 $mA/cm^2$, and the EL output was monitored constantly. The device with a hole-transporting layer formed of the plasma polymer and a 5 nm buffer layer showed a better operational stability than the device with a hole-transporting layer made of the conventionally used NPB.

The invention has been described in detail with particular reference to certain preferred embodiments thereof, but it will be understood that variations and modifications can be effected within the spirit and scope of the invention.

| PARTS LIST | |
|---|---|
| 10 | plasma polymerization system |
| 11 | chamber |
| 12 | pump conduit |
| 13 | control valve |
| 14 | pump |
| 15 | gas conduit |
| 16 | gas source |
| 17 | control valve |
| 18 | upper electrode |
| 19 | bottom electrode |
| 20 | electric power generator |
| 22 | substrate |
| 200 | organic light-emitting device (prior art) |
| 202 | light-transmissive substrate |
| 204 | light-transmissive anode |
| 208 | cathode |
| 210 | organic light-emitting structure |
| 212 | hole-transporting layer |
| 214 | light-emitting layer |
| 216 | electron-transporting layer |
| 300 | organic light-emitting device (testing structure) |
| 302 | light-transmissive substrate |
| 304 | light-transmissive anode |
| 306 | plasma polymer |
| 308 | cathode |
| 310 | organic light-emitting structure |
| 312 | hole-transporting layer |
| 314 | light-emitting layer |
| 316 | organic electron-transporting layer |
| 400 | organic light-emitting device |
| 402 | light-transmissive substrate |
| 404 | light-transmissive anode |
| 408 | cathode |
| 410 | organic light-emitting structure |
| 412 | plasma polymer |
| 414 | light-emitting layer |
| 416 | electron-transporting layer |
| 500 | organic light-emitting device |
| 502 | light-transmissive substrate |
| 504 | light-transmissive anode |
| 508 | cathode |
| 510 | organic light-emitting structure |
| 512a | hole-transporting layer formed of a conductive plasma polymer |
| 512b | thin buffer layer |
| 514 | light-emitting layer |
| 516 | electron-transporting layer |

What is claimed is:

1. An electroluminescent device, comprising:

a) a substrate, b) a conductive anode formed over the substrate, and c) an organic light-emitting structure formed over the anode including a hole-transport layer formed of a fluorocarbon based conductive polymer prepared by plasma polymerization of a fluorocarbon gas;

d) a cathode formed over the organic light-emitting structure.

2. The organic light-emitting device of claim 1 wherein the substrate is electrically insulative and light-transmissive.

3. The organic light-emitting device of claim 1 wherein the anode is a light-transmissive anode having a work function greater than 4 eV.

4. The organic light-emitting device of claim 1 wherein the organic light-emitting structure further includes:
   (i) an organic light-emitting layer formed over the hole-transporting layer; and
   (ii) an organic electron-transporting layer formed over the light-emitting layer.

5. The organic light-emitting device of claim 4 wherein the organic light-emitting layer is formed of a light-emitting host material selected from the group consisting of metal chelated oxinoid compounds.

6. The organic light-emitting device of claim 4 wherein the organic light-emitting layer further includes at least one dye capable of emitting light when dispersed in the light-emitting host material.

7. The organic light-emitting device of claim 4 wherein the electron-transporting layer is formed of a material selected from the group consisting of metal chelated oxinoid compounds.

8. The organic light-emitting device of claim 1 wherein the cathode material selected to have a work function less than 4.0 eV.

9. An electroluminescent device, comprising in order:
   a) a substrate;
   b) a conductive anode formed over the substrate;
   c) an organic light-emitting structure formed over the anode and a hole-transport layer formed of a fluorocarbon based conductive polymer prepared by plasma polymerization of a fluorocarbon gas and a buffer layer formed over the hole-transport layer; and
   d) a cathode formed over the organic light-emitting structure.

10. The organic light-emitting device of claim 9 wherein the substrate is electrically insulating and light-transmissive.

11. The organic light-emitting device of claim 9 wherein the anode is a light-transmissive anode having a work function greater than 4 eV.

12. The organic light-emitting device of claim 9 wherein the organic light-emitting structure further includes:
    (i) an organic light-emitting layer formed over the buffer layer; and
    (ii) an organic electron-transporting layer formed over the light-emitting layer.

13. The organic light-emitting device of claim 12 wherein the organic light-emitting layer is formed of a light-emitting host material selected from the group consisting of metal chelated oxinoid compounds.

14. The organic light-emitting device of claim 12 wherein the organic light-emitting layer further includes at least one dye adapted to emit light when dispersed in the light-emitting host material.

15. The organic light-emitting device of claim 12 wherein the electron-transporting layer is formed of a material selected from the group consisting of metal chelated oxinoid compounds.

16. The organic light-emitting device of claim 9 wherein the buffer material is selected from the group consisting of aromatic tertiary amine compounds.

17. The organic light-emitting device of claim 9 wherein the buffer layer has a thickness in a range of 1–10 nm.

18. The organic light-emitting device of claim 9 wherein the cathode material selected to have a work function less than 4.0 eV.

* * * * *